(12) United States Patent
Hagen

(10) Patent No.: US 6,292,677 B1
(45) Date of Patent: *Sep. 18, 2001

(54) POWER DELIVERY SYSTEM AND METHOD OF CONTROLLING THE POWER DELIVERY SYSTEM FOR USE IN A RADIO FREQUENCY SYSTEM

(75) Inventor: Rodney Wayne Hagen, Lake In The Hills, IL (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 9 days.

This patent is subject to a terminal disclaimer.

(21) Appl. No.: 08/883,095

(22) Filed: Jun. 26, 1997

(51) Int. Cl.[7] .................................................. H04M 1/00
(52) U.S. Cl. .............................. 455/572; 455/424; 455/8; 455/561; 330/124 D
(58) Field of Search ..................... 330/124 D; 455/560, 455/561, 8, 63, 9, 67.1, 115, 127, 226.1, 232.1, 249.1, 253.2, 234.1, 424, 572

(56) References Cited

U.S. PATENT DOCUMENTS

| | | | |
|---|---|---|---|
| 4,780,685 | * | 10/1988 | Ferguson .......................... 330/124 D |
| 5,666,646 | * | 9/1997 | McCollum et al. ...................... 455/8 |
| 5,831,479 | * | 11/1998 | Leffel et al. ...................... 330/124 D |

* cited by examiner

Primary Examiner—Lester G. Kincaid
(74) Attorney, Agent, or Firm—Donna Rogers Maddox; Heather L. Creps (57) ABSTRACT

A power delivery system for use in a radio frequency system is provided. The power delivery system including a power splitter and at least one sector amplifier that is responsive to the power splitter; where each of the sector amplifiers includes an input switch and an output switch that is responsive to the sector amplifier. The power delivery system also includes a power combiner that is responsive to each of the sector amplifiers; and at least one spare amplifier that is coupled by one or more relays to each of sector amplifiers that operates in conjunction with one or more of the sector amplifiers.

1 Claim, 11 Drawing Sheets

NOTE: FOR N-WAY
M=1, N=2
$Z_o = 50*(MN)^{\wedge}(1/4)$
$SWR\ (MAX) = N^{\wedge}(1/2)$

|  | REDUNDANCY AND/OR INCREASED CAPACITY | REDUNDANCY ONLY |
|---|---|---|
| $L_1$ | $\lambda/4$ * | $\lambda/4$ * |
| $L_1'$ | L1+L3 *** | $\lambda/4$ * |
| $L_2$ | $\lambda/4$ * | $\lambda/4$ * |
| $L_3$ | $\lambda/2$ ** | DONT CARE |

\* OR AN ODD MULTIPLE OF $\lambda/4$

\*\* OR A MULTIPLE OF $\lambda/2$ IN ADDITION, IF THE RELAY HAS A SIGNIFCANT DELAY. IT'S DELAY WILL NEED TO BE SUBTRACTED FROM $L_3$'S IDEAL LENGTH OF $\lambda/2$ OR MULTIPLES THEREOF.

\*\*\* ADD ON DELAY OF RELAY IF IT WAS ACCOUNTED FOR IN THE DERIVATION OF $L_3$'S LENGTH

|  | REDUNDANCY AND/OR INCREASED CAPACITY | REDUNDANCY ONLY |
|---|---|---|
| $L_1$ | $\lambda/2$ **** | $\lambda/4$ * |
| $L_1'$ | L1+L3 *** | $\lambda/4$ * |
| $L_2$ | $\lambda/4$ * | $\lambda/4$ * |
| $L_3$ | $\lambda/2$ ** | DONT CARE |

*FIG.9*

\* OR AN ODD MULTIPLE OF $\lambda/4$

\*\* OR A MULTIPLE OF $\lambda/2$ IN ADDITION, IF THE RELAY HAS A SIGNIFCANT DELAY. IT'S DELAY WILL NEED TO BE SUBTRACTED FROM $L_3$'S IDEAL LENGTH OF $\lambda/2$ OR MULTIPLES THEREOF.

\*\*\* ADD ON DELAY OF RELAY IF IT WAS ACCOUNTED FOR IN THE DERIVATION OF $L_3$'S LENGTH

\*\*\*\* OR A MULTIPLE OF $\lambda/2$

POWER DELIVERY SYSTEM AND METHOD OF CONTROLLING THE POWER DELIVERY SYSTEM FOR USE IN A RADIO FREQUENCY SYSTEM

FIELD OF THE INVENTION

The present invention relates generally to radio frequency systems and, more particularly, to a power delivery system for use in a radio frequency system.

BACKGROUND OF THE INVENTION

Extended linear power amplifier systems have been proposed for use in cellular base stations. These systems include a number of linear power amplifiers, where one or more amplifiers comprises one or more modules and the linear power amplifiers can make up one or more sectors of a cell of a radio frequency system. Such systems are typically used in communication systems such as in a base site of a radiotelephone system. In such systems, it is desirable that the number of linear power amplifier modules may be any number from a minimum number up to a maximum number of allowable amplifiers. In this manner, the amount of power output by the transmission unit of the base station may be adjusted. In addition, it is desirable that the system provides adequate power amplification efficiency across the entire range of selected amplifiers, i.e. from the minimum number to the maximum number of amplifiers.

Another reason for providing one or more amplifiers is to provide continued operation if one of the amplifiers fails. A conventional method of continuing operation is a method known as load shedding. In the load shedding method, after a fault is detected, all new calls that would be handled by the affected sector associated with the faulty amplifier are blocked and a predetermined percentage of the existing channels are taken out of service. After the fault has cleared, traffic is then returned to normal capacity. Although the load shedding procedure allows for continued operation after a failure condition, it would be desirable if the system could maintain the traffic level prior to the failure and reduce the impact resulting from the failure to call processing.

Another reason for providing one or more amplifiers is to provide continued uninterrupted operation during times of heavy cellular traffic, when one or more of the amplifiers is overloaded which could lead the blocking of existing channels and lost or dropped calls.

Accordingly, there is a need for an improved power delivery system and a method of controlling the power delivery system for use in a RF system, such as a cellular system.

DETAILED DESCRIPTION OF THE PREFERRED EMBODIMENTS

Generally the present invention provides a power delivery system which has a selectable route whereby one or more linear power amplifiers may be selectively activated or deactivated as needed. More specifically the present invention sets forth a method and apparatus for use of one or more spare, or additional, linear power amplifiers that are coupled or electrically connected to a radio frequency system having one or more sectors where each sector comprises one or more linear power amplifiers. Each of the linear power amplifiers of the one or more sectors can be comprised of one or more amplifier modules.

In a preferred embodiment of the present invention, a two sector radio frequency system, where each sector consists of a single linear power amplifier having a single module per sector, sector amplifier where each sector is coupled or electrically connected with a spare, or additional, linear power amplifier (spare amplifier) having a single module, such that the spare amplifier can be routed to either of the sectors. This is a basic configuration that is set forth for example and explanation purposes and will be expanded on below. Typically, in the above described configuration, the sector amplifier modules in each of the sectors are on-line and the spare amplifier is in a stand-by mode. During normal operation and normal or low periods of cellular traffic none of the RF power in any of the sectors reaches the spare in stand by mode. However if one of the sector amplifier modules develops a problem, such as a failure or heavy period of cellular traffic, part of, or all of the RF power in the sector amplifier module can be routed or directed to the spare amplifier module thereby allowing the spare to "act" as if it is the sector or an additional module to the linear power amplifier of the particular sector affected. In this typical preferred embodiment the remaining unaffected sector continues to operate without interruption and as if there is no problem with affected sector that has failed or is overloaded. In accordance with the preferred embodiments of the present invention it is preferrable if the spare amplifier is operating in parallel with the affected one or more sector amplifiers that the spare amplifier and the affected sector or sectors be of the same phase. More preferably the spare amplifier and the affected sector or sectors should be of the same phase or within an approximate range of no more or no less than 20 degrees.

Figure 1:
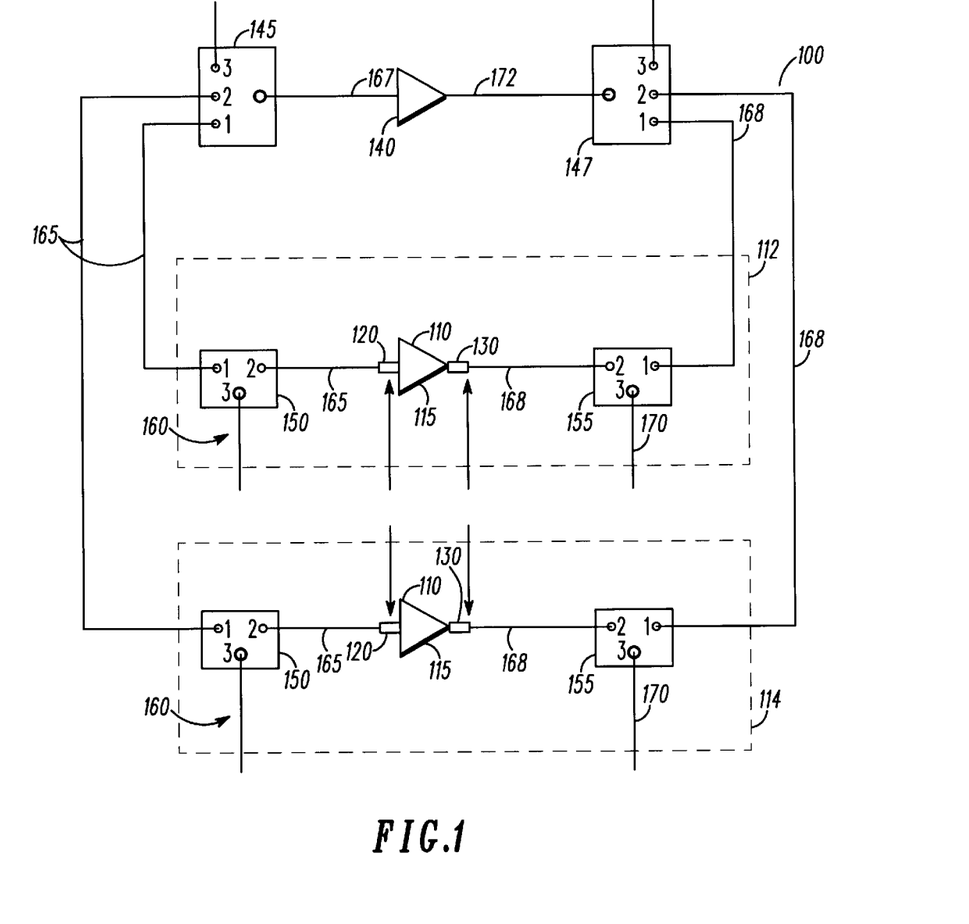
FIG. 1 is a block diagram of a preferred embodiment of radio frequency circuit of a power delivery system of the present invention.

Referring now to FIG. 1, a radio frequency system 100 having a plurality of linear power amplifiers is illustrated. In accordance with a preferred embodiment of the present invention, the radio frequency system 100 of FIG. 1 is composed of two sectors 112, 114, each sector having a linear power amplifier 110. The linear power amplifiers of each sector may be made up of one or more modules 115, identified as main amplifier 1 and main amplifier 2 respectively. Typically, one or more sectors form a radio frequency system cell. Each amplifier module is coupled to an input 120 and an output switch 130. In addition, in accordance with the preferred embodiment of the present invention a spare, or an additional linear power amplifier 140 is coupled via phasing lines 165, 168 to each linear power amplifier 110 of each sector to be used in place of or in parallel to the linear power amplifier. The spare, or additional amplifier, of the present invention having a single amplifier module is coupled to an input 145 and an output 147 relay via spare phasing lines 167, 172. The spare amplifier may be made up of one or more modules. As illustrated in FIG. 1, each sector includes a power, or an N-way, splitter 150 and power, or an N-way, combiner 155. The power splitter 150 receives an input signal 160 that may be split into a plurality of output signals. The output signal or signals 165 from the power splitter 150 are fed into the power amplifier modules of a sector. The output of the sector power amplifier modules 115 are each fed into the power combiner 155. The combiners 155 receives each of the outputs 168 from the one or more modules of the sector power amplifiers 115 and combines them to form an output signal 170.

Figure 2:
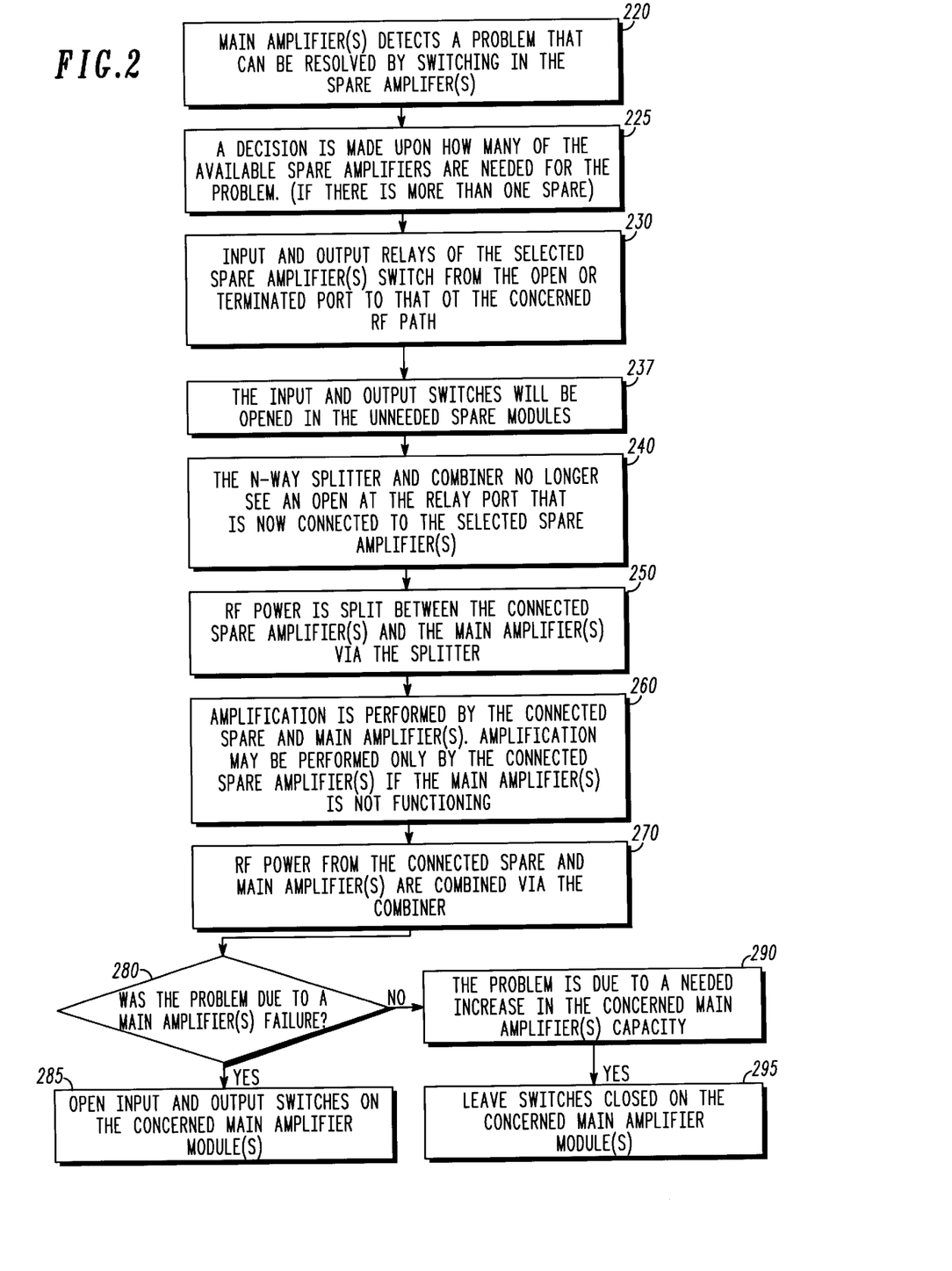
FIG. 2 is a flow chart of a method of controlling the power delivery system of the present invention in accordance with a preferred embodiment of the present invention.

Referring now to FIGS. 1 and 2, in accordance with a preferred embodiment of the present invention, if either of the main amplifiers 110 of either of the sectors 112, 114 detects a problem/event that requires a substitute amplifier or an additional amplifier, the spare amplifier 140 is electronically coupled to operate as the main amplifier experiencing the difficulty, or is electronically coupled to operate in parallel connection and in addition to the main amplifier experiencing the difficulty 220. Examples of a problem event or difficulty that would require the use of the spare amplifier 140 include but are not limited to the following: blown amplifier stage in a module; overheating of a module; poor intermodulation or otherwise poor performance; traffic overload; increased power by a carrier remotely or remote reconfiguration. If there is more than one spare amplifier or the spare amplifier has more than one module, upon examination of the particular problem a decision is made regarding how the resources of the spare amplifiers or the one or more modules of the spare amplifier will be allocated 225. More preferably upon detection of a problem or event that can be resolved by incorporation of the selected spare amplifier, the input 145 and output 147 relays are switched from the open or terminated port to that of the concerned RF path of the affected main amplifier 110, 230. Preferably if there is more than one spare amplifier or spare amplifier modules, the input and output switches of unneeded spare amplifier or unneeded spare amplifier modules are opened 237. Detection of a problem and the nature of the problem can be found through various sensors in the amplifier modules or through a power sensor. Such methods of detection are identified in related U.S. patent application Ser. No. 08/662,573 filed Jun. 13, 1996 (CE03173R, Leffel et al.) and herein incorporated by reference. In accordance with the preferred embodiment of the present invention, it is desirable to have at least one additional port in the input and output relay coupled to the spare amplifier than there are total number of sectors of the system. Once the input and output relays of the spare amplifier have been switched, thrown, moved the N-way splitter 150 and N-way combiner 155 no longer see an open at the relay ports 145, 147 that are connected to the spare amplifier 140, 240. In the preferred embodiment illustrated the RF power is split between the spare amplifier 140 and the affected main amplifier 110 via the splitter 150. Alternatively, one can couple power off a main line circuit, i.e. a 3dB coupler will perform an even split, but a higher insertion loss will result. Upon splitting the RF power between the spare amplifier 140 and the affected main amplifier 115, amplification is performed 260. Amplification may be performed by both the spare and affected main amplifier simultaneously or concurrently if the main amplifier is still functioning or may be performed by only the spare amplifier if the affected main amplifier is not functioning. Depending on the characteristics of the problem affecting the main amplifier after amplification has been performed the RF power from the spare and the main amplifier are combined via the combiner 270. This may depend on the severity of the problem. If a parallel stage in the module fails then the amplifier will still amplify; but will likely not perform to specification. If the module blows or loses a series stage then it will not amplify. The affected main amplifier is examined 280, if the problem is due to a main amplifier failure then the input 120 and output switches 130 of the main amplifier are opened 285. If however the affected main amplifier is examined 280 and the problem or event is the result of a necessity or need for increased capacity 290; then the input 120 and output 130 switches of the main amplifier are left closed 295. A computer connected to the amplifier may be used to detect the problem and the nature of the problem. To determine that a problem has ended typically either an alarm will clear or the traffic flow decreases below an accepted threshold. Once the input/output switches are left open on the main amplifier, it acts as if it isn't in the loop and then the amplification is performed solely by the spare amplifier. Alternatively, if the switches are left closed then the amplification is performed by both the spare and the main amplifiers. If the problem is a malfunction, the main amplifier may be taken out of service and replaced. If the problem is too much traffic, the spare amplifier will continue to assist until the traffic flow is reduced to an acceptable level.

Figure 3:
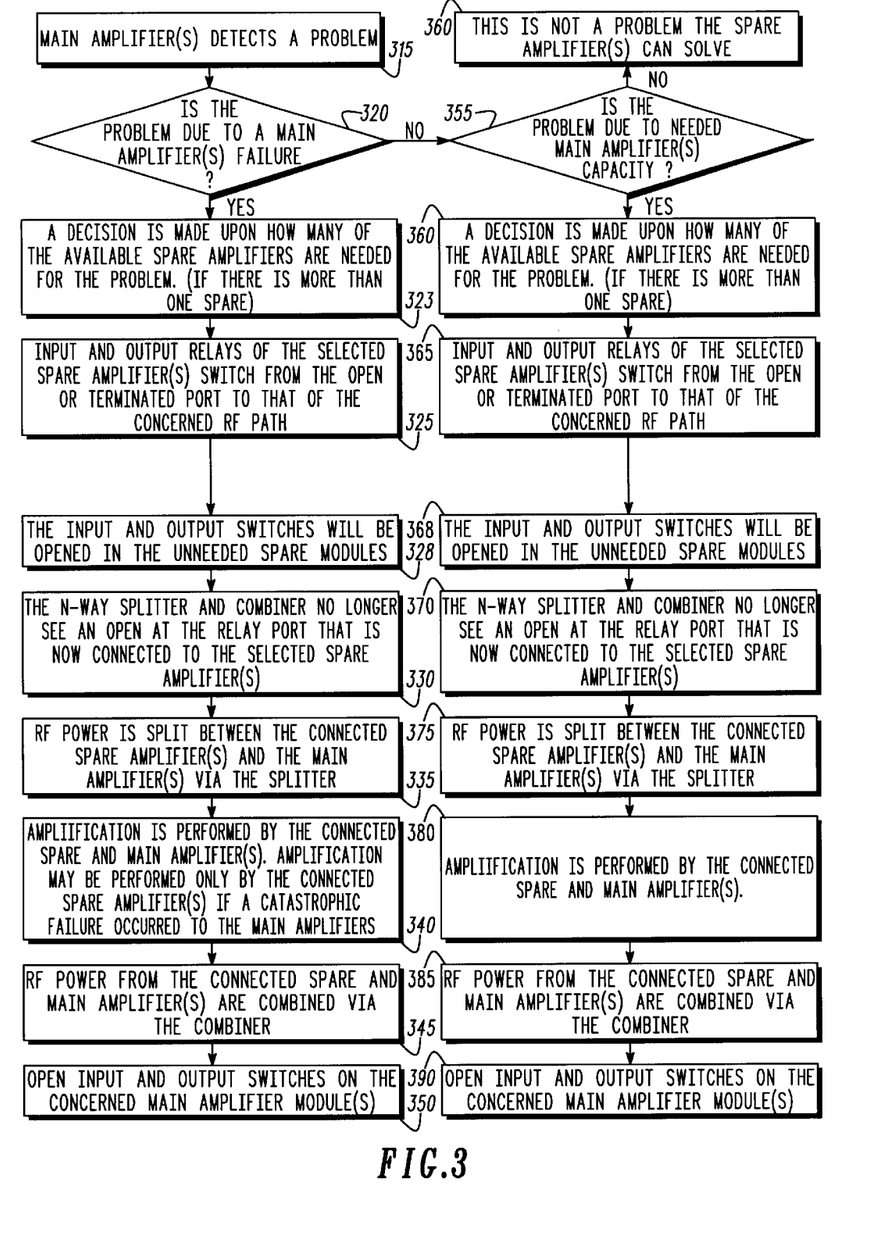
FIG. 3 is a flow chart of a method of controlling the power delivery system of the present invention according to another embodiment.

Referring now to FIGS. 1 and 3, an alternative preferred embodiment is illustrated and described. In this preferred embodiment one of the main amplifiers detects a problem 315. The affected main amplifier is immediately or simultaneously evaluated to determine if the problem is due to a failure of the main amplifier 320, or is due to a necessity or desire to have temporary increased capacity for that amplifier 355. If the problem or event is due to a failure in the main amplifier and there is more than one spare amplifier or the spare amplifier has more than one module a decision is made regarding how the resources of the spare amplifiers or the one or more modules of the spare amplifier will be allocated 323. In the embodiment illustrated, the input 145 and output relays 147 of the selected spare amplifier 140 are switched from the open or terminated port to that of the concerned or affected RF path 325. In accordance with this preferred embodiment of the present invention, it is preferable to have at least one additional port in the input and output relay coupled to the spare amplifier. Preferably if there is more than one spare amplifier or more than one spare amplifier module the input and output switches of the unneeded spare amplifier or unneeded spare amplifier modules are opened 328. Once the relays have been switched, the N-Way splitter and N-way combiner no longer detect an open at the relay port that is now connected to the spare amplifier 330. The RF power is now split between the spare amplifier and the main amplifier via the splitter 335. Amplification is performed by the spare amplifier if a catastrophic failure occurred within the main amplifier or may be performed by both the spare and the main amplifiers 340. The RF power from the spare and affected main amplifiers are combined via the combiner 155, 345. The input and output switches of the affected main amplifier are then opened 350.

However, in this preferred embodiment, similar to the description of FIG. 2, if the problem or event is found to be caused by a desire or need for increased capacity of the affected, concerned main amplifier 355, then substantially similar to 323, 325, and 328 above, and there is more than one spare amplifier or the spare amplifier has more than one module a decision is made regarding how the resources of the spare amplifiers or the one or more modules of the spare amplifier will be allocated 323. In the embodiment illustrated, the input 145 and output relays 147 of the selected spare amplifier 140 are switched from the open or terminated port to that of the concerned/affected RF path 365. Preferably if there is more than one spare amplifier or more than one spare amplifier module the input and output switches of the unneeded spare amplifier or unneeded spare amplifier modules are opened 328. Once the relays have been switched, the N-Way splitter and N-way combiner no longer detect an open at the relay port that is now connected to the spare amplifier 370. The RF power is now split between the spare amplifier and the main amplifier via the splitter 375 Amplification is performed by both the spare and the main amplifier 380. The RF power from the spare and affected main amplifier are combined via the combiner 155, 385. The input and output switches of the affected main amplifier are left closed 390. Similar to that described above, if the problem is a main amplifier malfunction, the spare will continue to operate until the main amplifier is replaced. If the problem is traffic, the spare will continue to operate until the traffic is reduced or until it is no longer desired.

Figure 4:
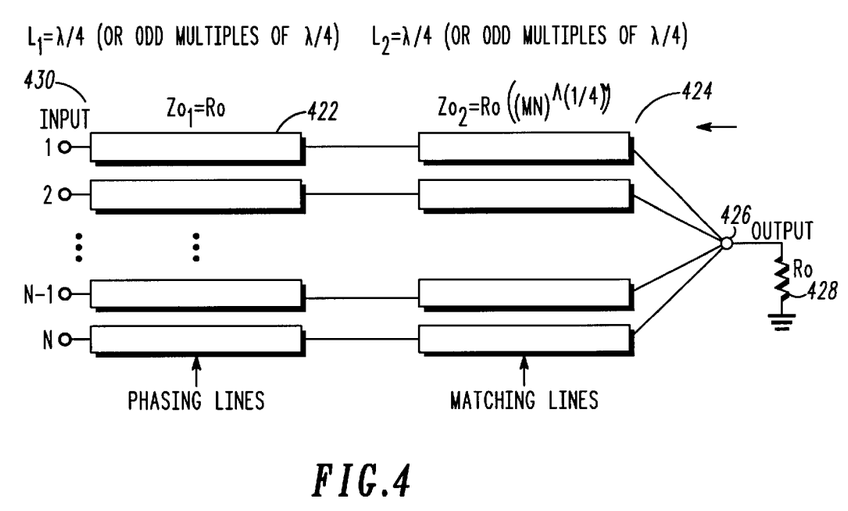
FIG. 4 is a schematic diagram of a preferred embodiment of the power combiner in accordance with the present invention.

Referring to FIGS. 1 and 4, a power combiner, or N-way combiner 155, 400 according to a preferred embodiment is illustrated. The N in N-way combiner equals any number, such that in theory any number of signals can be combined or split. The power combiner 400 includes a plurality of phasing transmission lines 422, a plurality of matching transmission lines 424, a common node 426, an output load 428, and a set of input nodes 430. The set of input nodes 430 are each coupled to an amplifier module within the set of amplifiers 110. Each of the phasing transmission lines 422 is connected to one of the input nodes 430 at one end and is connected to one of the matching transmission lines 424 at the other end. Each of the phasing transmission lines 422 has a characteristic impedance which is substantially equivalent to the output load 428. In this example, since the output load has an impedance of 50 Ohms, each of the phasing transmission lines has a characteristic impedance of about 50 Ohms. Also, each of the phasing transmission lines 422 has a length which is equal to a quarter wavelength or an odd multiple thereof.

Each of the matching transmission lines 424 is connected to the common node 426. In addition, each of the matching transmission lines 424 has a length which is equal to a quarter wavelength or an odd multiple thereof. Further, each matching transmission line 424 has a characteristic impedance determined according to a function of the minimum and maximum number of amplifier modules in the set of amplifiers 110. In the preferred embodiment the function is a nonlinear function. Most preferably, the function is the fourth root of the product of the minimum number of amplifiers and the maximum number of amplifiers, which is then multiplied by the load impedance 428. This is expressed in the FIG. 4 as the function raised to the ¼ power. However, other nonlinear functions, such as a cube root function although not as optimal as the fourth root function will also provide suitable performance. This formula is illustrated in FIG. 4 adjacent to the matching transmission lines 424, and below:

$$Z_{o2} = R_o (MN)^{-(1/4)}$$

The common node 426 is connected to each of the matching transmission lines 424 and is also connected to a load, typically a 50 Ohm impedance 428. Although the above description with reference to FIG. 4 illustrates a power combiner 155,400, the circuit 400 is also suitable for use as the power splitter 150.

Figure 5:
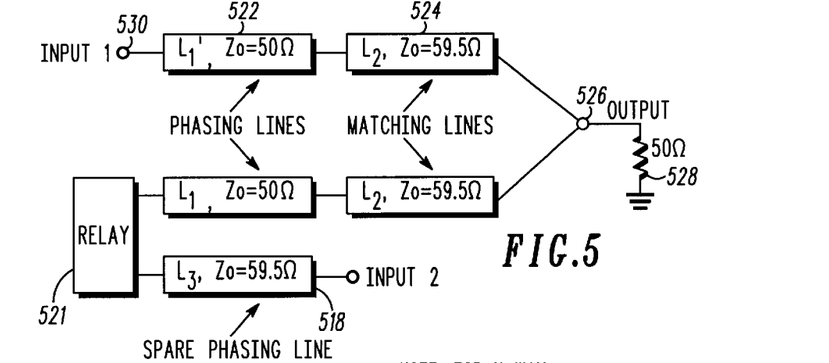
FIG. 5 is a schematic diagram of a preferred embodiment of implementation of a power combiner in accordance with the present invention and as set forth in FIG. 4
Figure 6:
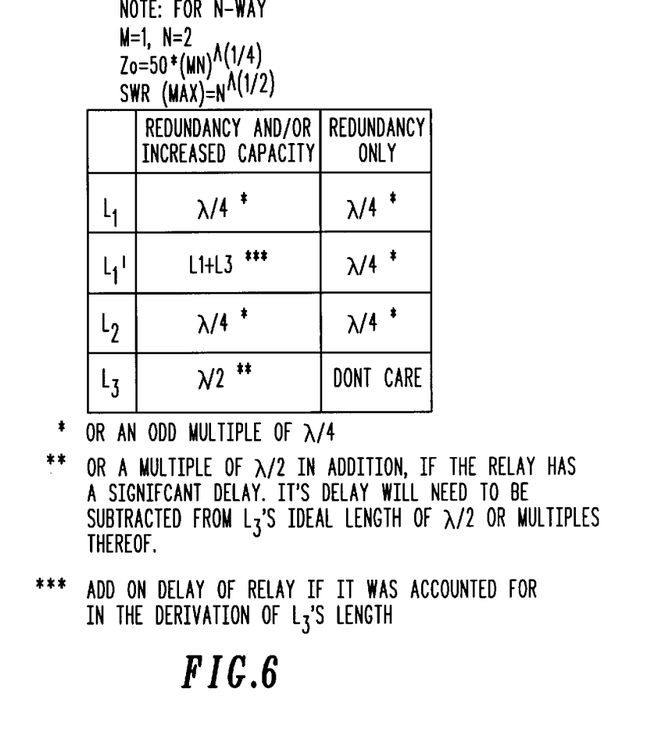
FIG. 6 is a table describing the relationship of the phasing lines of FIG. 5.

Referring to FIGS. 5 and 6, an example of a power combiner 155, 500 having a minimum of one amplifier and a maximum of two amplifiers, and a table setting forth the preferred wave length formula for the components of the power combiner are illustrated. The combiner 500 includes two phasing transmission lines 522, two matching transmission lines 524, one spare phasing line, one relay, and a common node 526. Each of the phasing transmission lines 522 has an impedance equal to Ro, or 50 Ohms and a length equal to a fractional multiple wavelength as set forth in FIG. 6. The spare phasing transmission line 518 has an impedance equal to Ro, or 50 Ohms and a length equal to a fractional multiple wavelength as set forth in FIG. 6. Each of the matching transmission lines has a length of a fractional wavelength as set forth in FIG. 6 and has a characteristic impedance of 59.5 Ohms. The impedance of the matching transmission lines 524 is determined according to the preferred fourth root formula described above. Those skilled in the art will appreciate that the power combiner circuit 500 has many advantages. For example, the power combiner circuit 500 provides for improved power and efficiency across a range of amplifiers that may be connected to the combiner 500. Further, the preferred circuit 500 provides improved efficiency without degrading the useful bandwidth of the combiner.

Figure 7:
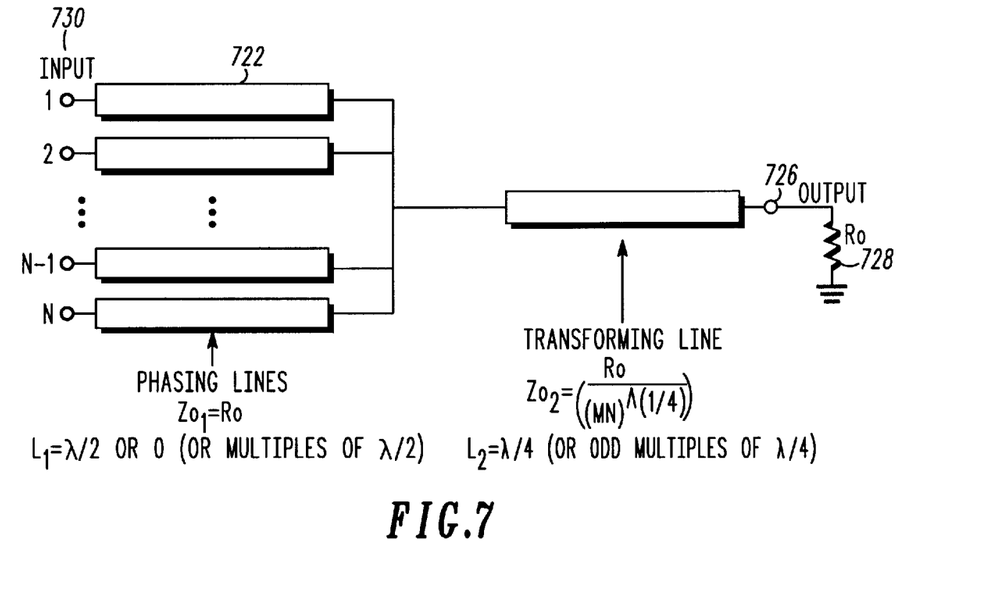
FIG. 7 is a schematic diagram of another preferred embodiment of the power combiner in accordance with the present invention.

Referring now to FIG. 7, a second preferred embodiment of a power combiner 700 is illustrated. The combiner 700 includes phasing lines 722, and a transforming line 724 which is connected to an output node 726. The output node 726 is connected to a load resistor 728. The phasing lines 722 are each connected to one of a set of input nodes 730 which support and are coupled to a set of modules in amplifier 110. The phasing transmission lines 722 each have a length of one-half wavelength or an even multiple of $\lambda/2$ or 0 and each have a characteristic impedance of about 50 Ohms. The transforming line 724 is coupled to each of the phasing lines 722 at one end and is coupled to the output node 726 at the other end. The transforming line 724 has a length of one-quarter wavelength or an odd multiple of $\lambda/4$. In the preferred embodiment, the transforming line 724 has a characteristic impedance determined in accordance with the formula shown in FIG. 7. The characteristic impedance of the transforming line is calculated by dividing the load resistor impedance by the fourth root of the product of the minimum number of amplifiers connectable to the set of inputs 730 and the maximum number of amplifiers connectable to the inputs 730. This is illustrated in FIG. 7 as the characteristic impedance of the transforming line and is calculated by dividing the load resistor impedance by the one/fourth power of the product of the minimum number of amplifiers connectable to the set of inputs 730 and the maximum number of amplifiers connectable to the inputs 730. This formula is set forth below:

$$Z_{O2} = \left( \frac{R_o}{(MN)^{\wedge(1/4)}} \right)$$

Those skilled in the art will appreciate that some applications will be more suitable for using the combiner 400, and other applications will be more suitable to the combiner 700. One factor in determining whether to use the combiner 400 or the combiner 700 will be the calculated length and the characteristic impedance of the transforming line 724. In some applications the characteristic impedance of the transforming line 724 may be too small to be implemented with existing transmission line technology. In this case, the combiner 400 illustrated in FIG. 4 should be used instead. Also, those skilled in the art will appreciate that any of the transmission lines described herein may be produced according to well known transmission line technology, such as strip line technology. Preferably, considering practical size constraints, the transmission line technology chosen should be suitable for applications with a frequency greater than 200 megahertz.

Figure 8:
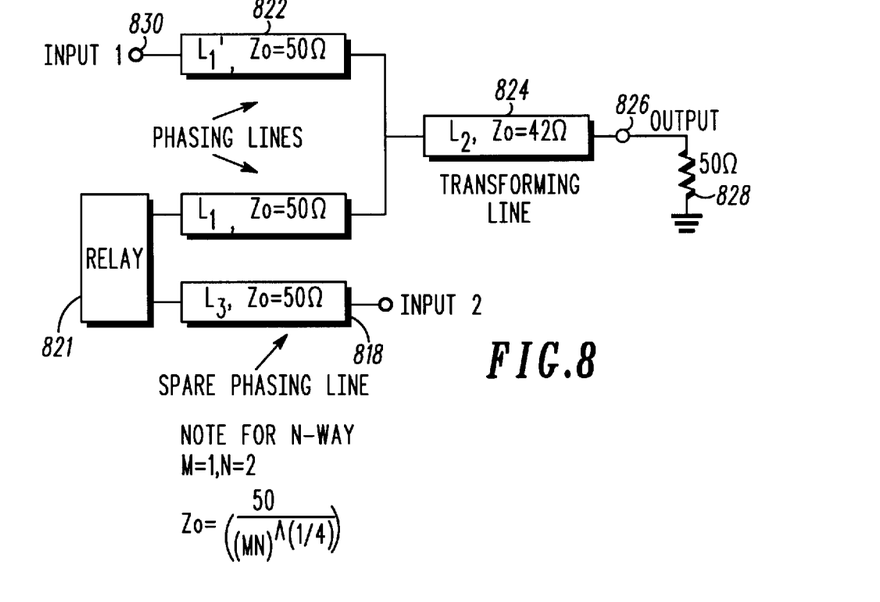
FIG. 8 is a schematic diagram of preferred embodiment implementation of the power combiner in accordance with the present invention and as set forth FIG. 7.
Figure 9:
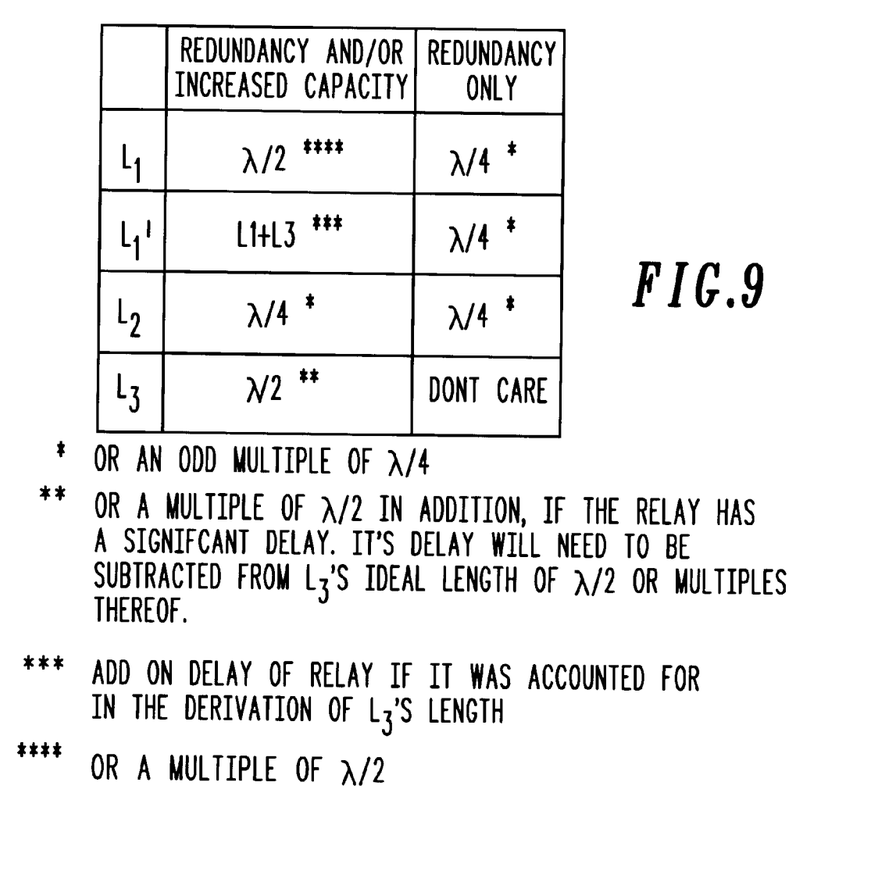
FIG. 9 is a table describing the relationship of the phasing lines of FIG. 8.

Referring to FIGS. 8 and 9, an embodiment of a power combiner 800 and a table setting forth the preferred wavelength formula for the components of the power combiner are shown. More particularly, FIGS. 8 and 9 illustrate a design example of a power combiner in accordance with FIG. 7.

The power combiner illustrated has a minimum of one amplifier and a maximum of two amplifiers. The combiner 800 includes two phasing lines 822, one spare phasing line 818, one transforming line 824, one relay (or switch), and a common node. The relationships to the electrical length of the phasing lines 822, spare phasing line 823, and transforming line 824 are illustrated in FIG. 9. The characteristic impedance of the transforming line 42Ω as calculated from the preferred formula illustrated in FIG. 7 where M=1, N=2, and R$_o$=50. The characteristic impedance of the phasing and spare phasing line are equal to Ro or 50Ω.

Referring now to FIGS. 1, and 10 through 13, FIGS. 10 through 13 are substantially similar to FIG. 1, however they illustrate various preferred alternative embodiments of the present invention. These are presented for examplatory purposes and are not intended to limit in any way the present invention to the preferred alternative embodiments illustrated but are intended to include alternatives obvious to those skilled in the art in accordance with the teachings set forth herein.

Figure 10:
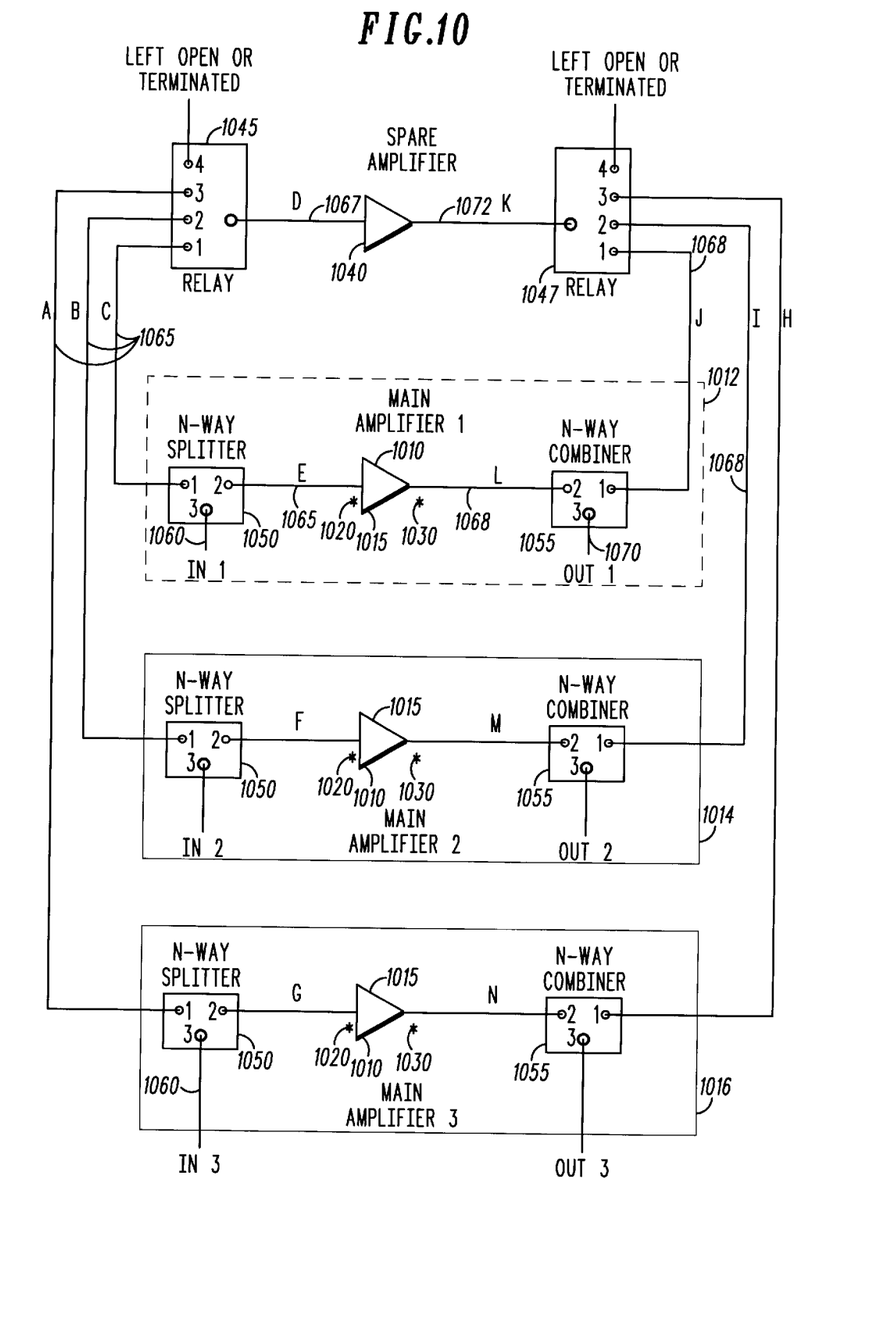
FIG. 10 is a block diagram of a preferred embodiment of radio frequency circuit of a power delivery system of the present invention.

Referring now to FIG. 10, a radio frequency system 1000 having a plurality of linear power amplifiers is illustrated. In accordance with a preferred embodiment of the present invention, the radio frequency system 1000 of FIG. 1 is composed of three sectors 1012, 1014, and 1016 each sector having a linear power amplifier 1010. Each of the linear power amplifiers may be made up of one or more amplifier modules 1015, identified as main amplifier 1, main amplifier 2, and main amplifier 3 respectively. In accordance with this preferred embodiment and for illustrative purposes only, each sector amplifier is comprised of a single module 1015, although a plurality of modules could be used. Each module is coupled to an input 1020 and an output switch 1030. In addition, in accordance with the preferred embodiment of the present invention the spare, or an additional linear power amplifier 1040 is coupled to each sector 1012, 1014, and 1016 via phasing lines 1065, 1068. The spare, or additional amplifier, of the present invention is coupled to an input 1045 and an output relay 1047 via spare phasing lines 1067, 1072. Substantially similar to FIG. 1, each sector includes a power, or an N-way, splitter 1050 and power, or an N-way, combiner 1055. The power splitter 1050 receives an input signal 1060 that may be split into a plurality of output signals. The output signal or signals 1065 from the power splitter 1050 are fed into the power amplifier modules of a sector. The output of the power amplifier modules 1015 are each fed into the power combiner 1055. The combiners 1055 receives each of the outputs 1068 from the one or more modules 1015 of the sector power amplifiers 1010 and produces an output signal 1070. In the preferred embodiment illustrated the input 1045 and output 1047 relay switch may have at least one additional port than those illustrated in FIG. 1. Preferably there is at least one port more in the input and output relays of the spare amplifier module than there are sectors coupled to the spare amplifier module. This is preferred for all embodiments of the present invention. Substantially similar to the operation of spare amplifier module illustrated in FIG. 1, the spare amplifier module can assist only one sector at a time. For example, if sector one and sector three experience a problem such as a failure at the same time the spare amplifier module can only be used to assist, or act as a replacement for only one of the affected sectors, not both simultaneously. The same is true if sector one and sector three are experiencing periods of heavy traffic that would require the additional, or spare amplifier module. A decision in both these scenarios must be made as to which sector the resources of the spare amplifier module will be directed. This election can be continuously revised, and the resources of the spare amplifier module can be continuously diverted between the affected sectors, regardless of whether the affected sectors have been fixed or the traffic flow returned to normal. Generally, the reason only one sector can be assisted at a time with the resources of the spare amplifier is because in this preferred embodiment as is FIG. 1, there is only a single spare amplifier interconnected to the system and more particularly coupled to the respective sectors. In accordance with the teaching of the present invention, multiple spare amplifiers or a spare amplifier having multiple modules may be configured within the radio frequency system such that the resources of the spare amplifiers or multiple spare modules may be divided or diverted to various sectors simultaneously, such that one or more sectors can be assisted at the same time.

Figure 11:
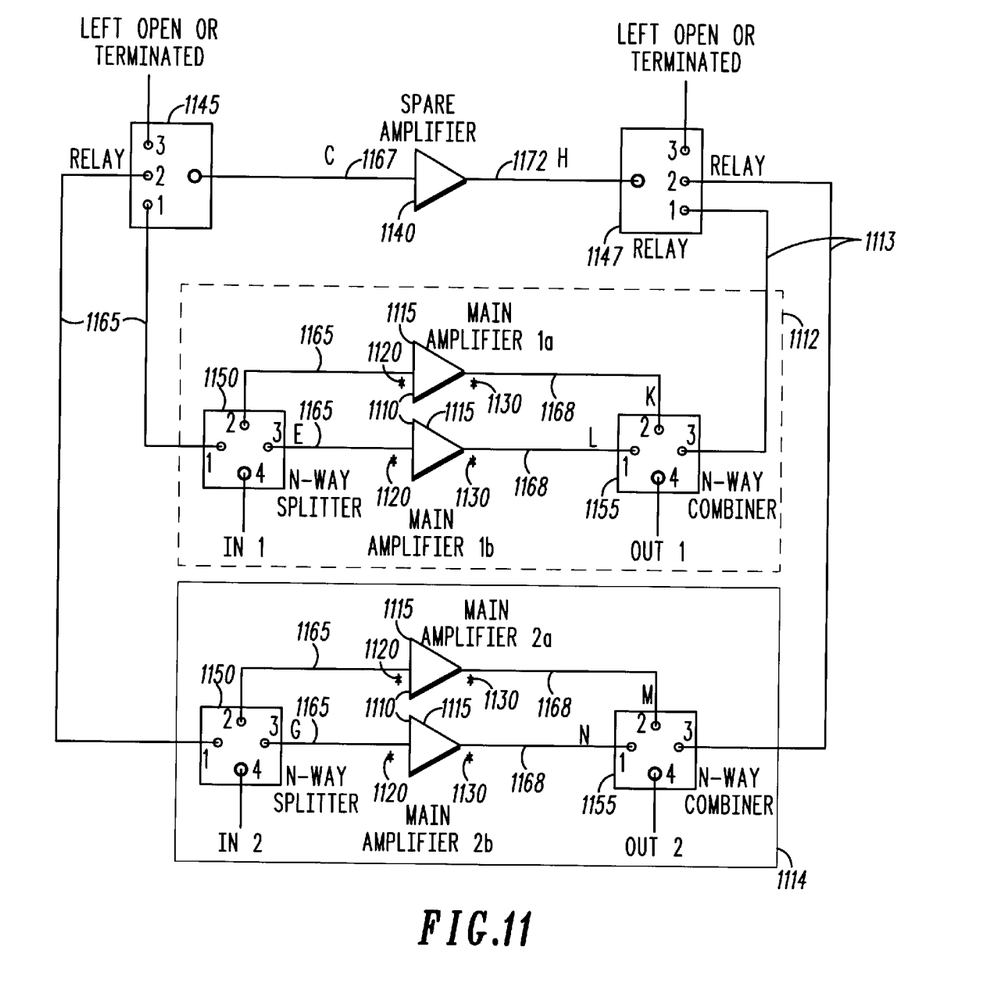
FIG. 11 is a block diagram of a preferred embodiment of radio frequency circuit of a power delivery system of the present invention.

Referring now to FIG. 11, a radio frequency system 1100 having a plurality of linear power amplifiers is illustrated. In this preferred embodiment the system 1100 is composed of two sectors 1112, 1114. In the preferred embodiment illustrated each sector includes a linear power amplifier having a plurality of modules, where the modules are identified as main amplifier 1a 1110 and main amp 1b 1110, for sector one and main amplifier 2a 1110 and 2b 1110 for sector two. The amplifiers and amplifier modules are each identified with the same reference numeral to illustrate that the amplifiers themselves are identical. In an alternative preferred embodiment the individual amplifiers do not have to be identical. However, preferably, they should be of similar phase if the spares are to be used in parallel with the main amplifiers. If they are not used in parallel with existing main amplifiers then phase is not a concern. Amplitude similarity is of secondary importance. Meaning it is not necessary to have identical amplitudes but if you are replacing an amplifier that has failed then in most situations it is desirable to have a similar replacement to get similar performance, or a transparent change. In this preferred embodiment the sector amplifiers are coupled via phasing lines 1165, 1168 to a spare amplifier having a single module 1140. Generally, if one or more of the main amplifier modules experiences a problem, such as a failure or traffic overload, the spare amplifier can be activated. For example if Sector One 1112 experiences a problem and main amplifier module 1*a* is the module experiencing the problem, the spare amplifier module 1140 can be coupled to either act as a replacement for module main 1*a* 1110 or act as an additional module for sector one 1112. If Sector One 1112 experiences a problem with both main amplifier module 1*a* and main amplifier module 1*b*, the spare amplifier 1140 can be coupled to sector one to act a replacement for either main amplifier module 1*a* or main amplifier module 1*b* or as an additional or spare amplifier module for sector one 1112. The spare can act as a replacement for both main 1*a* and main 1*b* simultaneously should both main modules fail but the sector will be at half capacity assuming the capacity of one spare module is equal to one main module. The spare amplifier can also act as an additional or spare amplifier to main 1*a* and main 1*b* modules simultaneously if both should experience a period of heavy traffic concurrently. The main modules and the spare would all be in parallel with each and would share the load. If however, both sectors, Sector One 1112 and Sector Two 1114 experience a problem with one or both of their respective amplifier modules, main 1*a*, main 1*b*, main 2*a*, and main 2*b* simultaneously, an election must be made as to which sector the resources of the spare amplifier 1140 will be dedicated. For example if there is a problem such as a failure of Sector One, module main amplifier 1*a*, and Sector 2, module main amplifier 2*a*, an election must be made as to which amplifier the spare will be routed too to act as a temporary substitute amplifier. Similarly, if sector one, main 1*b* and sector two main 2*b* experience a problem such as traffic overload at the same time an election must be made as to which sector the resources of the spare amplifier will be devoted. This election can be continuously revised as the various needs of the radio frequency system dictate. Therefore if spare amplifier 1140 is dedicated to sector one because of a failure of module main amplifier 1*a*, at the same time that sector two is experiencing a failure of its module main amplifier 1*b*. The allocation of the resources of the spare amplifier can be switched between the sectors one and two at any time if it is determined it is necessary or more beneficial to do so. This switch can occur regardless of whether sector one, main 1*a* has resumed operational status or not. The same is true if the nature of the problem is not failure of the sector amplifier module but merely a temporary overload of the sector module. For example if Sector one, main 1*b* and Sector two, main 2*b* are experiencing overload conditions at the same time the spare amplifier may be routed to either sector in an alternative pattern until heavy traffic condition of either or both of the sectors subsides. Again, however in the embodiment illustrated in FIG. 11, the spare amplifier can not assist both sector one and sector two simultaneously.

For purposes of clarity, FIG. 11 is substantially similar to the embodiment illustrated in FIG. 1 in that each module of the respective amplifiers for each sector is coupled individually to an input 1120 and an output 1130 switch; and each sector includes a power, or an N-way, splitter 1150 and a power, or an N-way, combiner 1155. In the preferred embodiment illustrated a 3 way splitter and combiner are illustrated. The power splitter 1150 receives an input signal 1160 that may be split into a plurality of output signals. The output signal or signals 1165 from the power splitter 1150 are fed into the power amplifier modules of a sector, for example main 1*a* and main 1*b*,. The output of the power amplifier modules 1115 are each fed into the power combiner 1155. The combiners 1155 receive each of the outputs 1168 from the one or more modules of the sector power amplifiers 1110 and produces an output signal 1170. In addition, and substantially similar to the preferred embodiment of FIG. 1, the spare amplifier 1140 is also coupled to an input relay 1145 and an output relay 1147 switch via spare phasing lines 1167, 1172.

Figure 12:
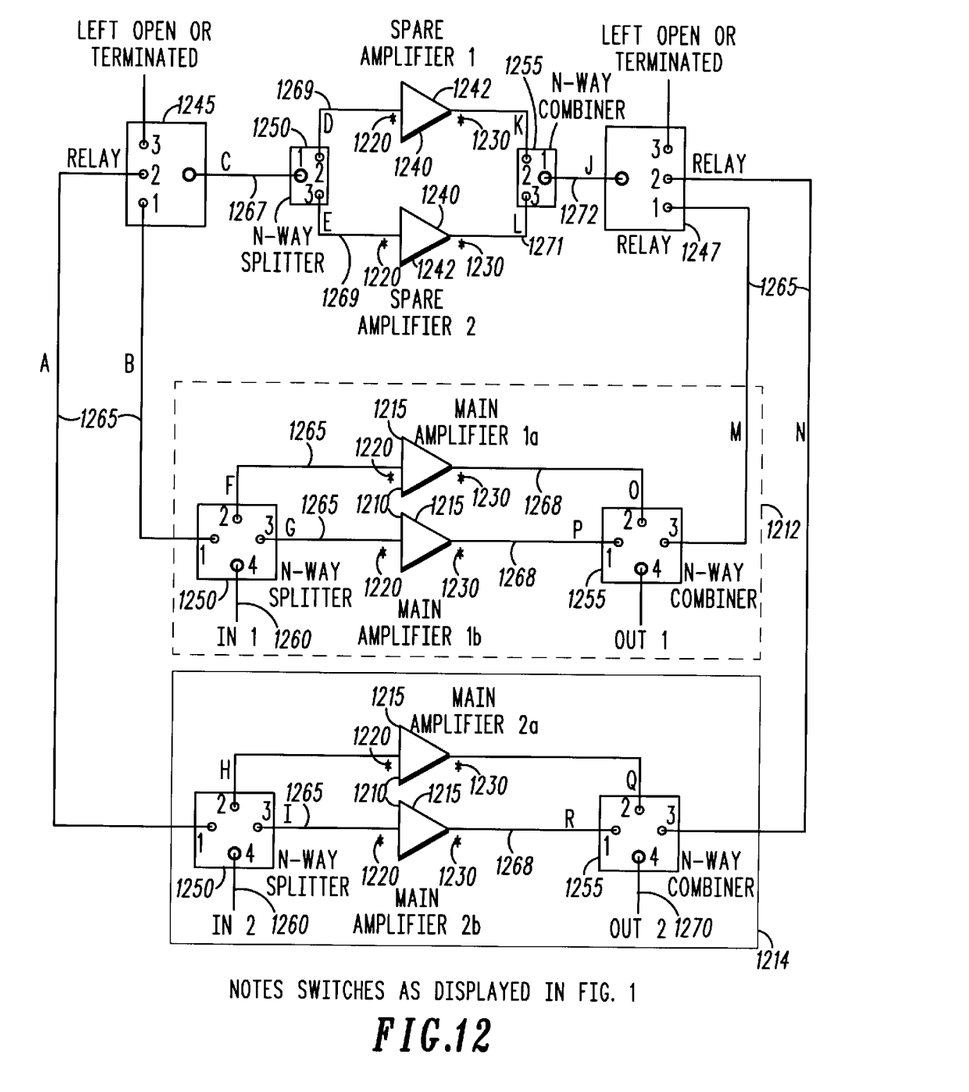
FIG. 12 is a block diagram of a preferred embodiment of radio frequency circuit of a power delivery system of the present invention.

Referring now to FIG. 12, a radio frequency system 1200 having a plurality of linear power amplifiers is illustrated. In this preferred embodiment the system 1200 is composed of two sectors 1212, 1214. In the preferred embodiment illustrated each sector includes a linear power amplifier having a plurality of modules 1215, where the modules are identified as main amplifier 1*a* 1215 and main amp 1*b* 1215 for sector one, and main amplifier 2*a* 1215 and 2*b* 1215 for second two. The amplifier modules are each identified with the same reference numeral to illustrate that the amplifier modules themselves are identical. In an alternative preferred embodiment the individual amplifiers or amplifier modules do not have to be identical. However, preferably they should be of similar phase if the spare is to be used in parallel with the main amplifiers. If they are not used in parallel with existing main amplifiers then phase is not a concern. Amplitude similarity is of secondary importance. Meaning it is not necessary to have identical amplitudes but if you are replacing an amplifier that has failed then in most situations it is desirable to have a similar replacement to get similar performance, or a transparent change. In this preferred embodiment the sector amplifiers are coupled via phasing lines 1265, 1268 to a spare amplifier 1240 also having a plurality of modules; identified as spare amplifier 1 1242 and spare amplifier 2 1242. In this preferred embodiment, the spare amplifier having a plurality of modules is coupled to the sector amplifiers via input and output relay switches. 1245 and 1247 respectively. However, in this preferred embodiment the individual modules of the spare amplifier are also coupled to a power, or N-way, splitter 1250 and a power, or N-way, combiner 1255. That are substantially similar to those that are coupled to the sector amplifiers. In the preferred embodiment illustrated, the sector amplifiers use a 3way splitter and combiner and the spare amplifier uses a 2way splitter and combiner. However, if for example there were three spare modules in the spare amplifier, the spare amplifier would use a 3way splitter and combiner, thus the spare would have the same number of ports as the sector amplifiers. Additionally, each module of the spare amplifier, spare amplifier 1*a* 1242 and spare amplifier 1*b* 1242 are coupled to an input 1220 and an output 1230 switch substantially similar to the input 1220 and output switches 1230 coupled to the individual modules of the sector amplifiers. Similar to the previous embodiments discussed, the spare amplifier is activated when one of the sector amplifiers are affected or disabled due to difficulties. In accordance with this preferred embodiment, depending on the severity of the problem with the affected sector amplifier, one or more of the modules of the spare amplifier may be activated. For example, if Sector one amplifier is experiencing a problem with module Main amplifier 1*a* and all other modules of sector one are operating normally, and sector two is experiencing no difficulties, than the spare amplifier, module spare amplifier 1*a* may be activated to assist or act as a replacement for sector one, main amplifier 1*a*. Alternatively, both modules of the spare amplifier may be activated in this situation even though only one module, main amplifier 1a of Sector One is affected. In another preferred embodiment of the configuration illustrated in FIG. 12, if one or more of the modules of a particular sector amplifier is experiencing difficulty both modules of the spare amplifier may be activated to assist or act as replacement modules for the affected sector. If the problem is found to require more than one module of the spare amplifier, the input and output switches of the spare amplifier modules are closed. If the problem is found to not require the resources of all the spare module amplifiers, the input and output switches of the unneeded spare modules are left open. A gateway controller card similar to that discussed in U.S. patent application Ser. No. 08/662,573 filed Jun. 13, 1996 (CE03173R Leffel et al.), herein incorporated by reference coordinates the switching sequence by delivering the commands to the amplifier modules, where the commands are derived from programming based on the inputs to the gateway by the amplifier modules sensors, or the gateway can relay a system operator's commands to the amplifier modules.

Substantially similar to the preferred embodiment illustrated in FIG. 11, if both sector amplifiers of the radio frequency system experience difficulties in one or more of their individual modules concurrently, an election must be made as to which sector the resources of the spare amplifier module or modules will be dedicated. In this preferred embodiment the resources of the spare amplifier cannot be divided between the various sectors simultaneously. Only one sector at a time can be assisted by the resources of the spare amplifier. The decision as to which sector the resources of the spare amplifier are directed can be continuously revised, such that the resources of the spare amplifier can be alternated between the sector amplifiers.

For purposes of clarity, FIG. 12 is substantially similar to the embodiment illustrated in FIG. 11 except that each module of the respective amplifiers for each sector and each module for the spare amplifier are coupled via spare phasing lines 1267,1269,1271, and 1272 individually to an input 1220 and an output 1230 switch; and each sector and the spare amplifier includes a power, or an N-way, splitter and a power, or an N-way, combiner. The power splitter 1250 coupled to the sector amplifiers receives an input signal 1260 that may be split into a plurality of output signals. The output signal or signals 1265 from the power splitter 1250 coupled to the sector amplifiers are fed into the power amplifier modules of a sector, for example main 1a and main 1b,. The output of the power amplifier modules 1215 are each fed into the power combiner 1255. The combiners 1255 receive each of the outputs 1268 from the one or more modules of the sector power amplifiers 1215 and produces an output signal 1270. In the preferred embodiment illustrated the modules of the spare amplifier are coupled to a splitter and combiner and therefore have a common path.

Figure 13:
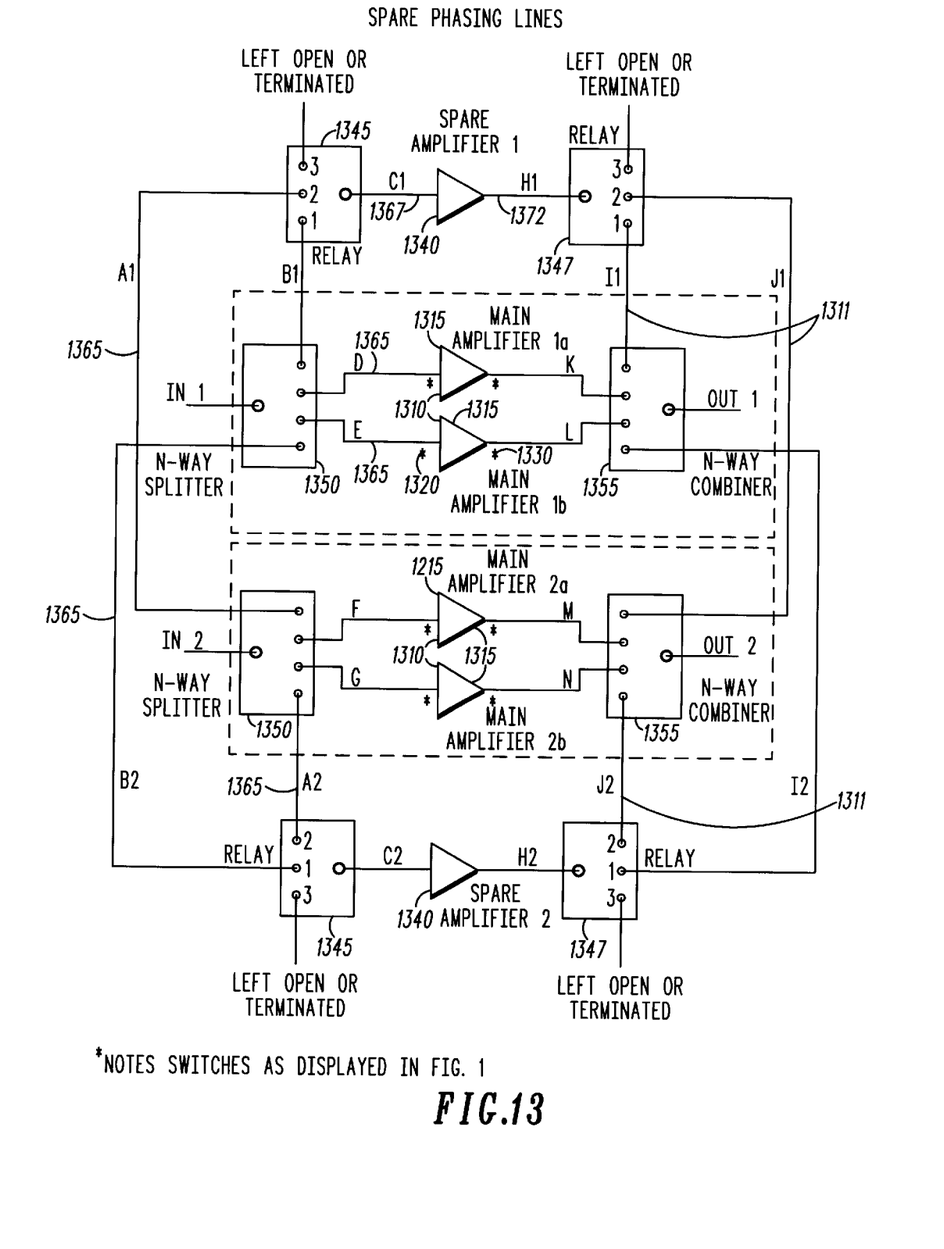
FIG. 13 is a block diagram of a preferred embodiment of radio frequency circuit of a power delivery system of the present invention.

Referring now to FIG. 13, a radio frequency system 1300 having a plurality of linear power amplifiers is illustrated. In this preferred embodiment the system 1300 is composed of two sectors 1312, 1314. In the preferred embodiment illustrated each sector includes a linear power amplifier having a plurality of modules 1315, where the modules are identified as main amplifier 1a 1315 and main amp 1b 1315, for sector one and main amplifier 2a 1315 and 2b 1315 for the second sector. The amplifiers are each identified with the same reference numeral to illustrate that the amplifiers themselves are identical. In an alternative preferred embodiment the individual amplifiers do not have to be identical. However preferably they should be of similar phase if the spares are to be used in parallel with the main amplifiers. If they are not used in parallel with existing main amplifiers then phase is not a concern. Amplitude similarity is of secondary importance. Meaning it is not necessary to have identical amplitudes but if you are replacing an amplifier that has failed then in most situations it is desirable to have a similar replacement to get similar performance, or a transparent change.

In this preferred embodiment the sector amplifiers are coupled via phasing lines 1365, 1368 to a spare amplifier having a plurality of independent modules, where the modules are independently available to the various sectors and sector modules such that their resources may be allocated to one or more sectors simultaneously. Alternatively, a plurality of spare amplifiers with one or more modules can be used. As illustrated in FIG. 13, the modules are identified as spare amplifier 1, 1315 and spare amplifier 2, 1315. In this preferred embodiment, the modules of the spare amplifier are configured such that each module, spare amplifier 1, 1315 and spare amplifier 2, 1315 are coupled to the sector amplifiers through separate individual input 1345 and output 1347 relay switches via spare phasing lines 1367, 1372. In this preferred embodiment the modules of the spare amplifier are not coupled to a splitter and a combiner as illustrated in FIG. 12 and therefore do not have a common path and can operate independently of each other.

Similar to the previous embodiments discussed, the spare amplifier is activated when one of the sector amplifiers are affected or disabled due to difficulties. In accordance with this preferred embodiment, depending on the severity of the problem with the affected sector amplifier, one or more of the modules of the spare amplifier may be activated. For example, if Sector one amplifier is experiencing a problem with module Main amplifier 1a and all other modules of sector one are operating normally, and sector two is experiencing no difficulties, than the spare amplifier, module spare amplifier 1 may be activated to assist or act as a replacement for sector one, main amplifier 1a. Alternatively, both of the spare amplifiers may be activated in this situation even though only one module, main amplifier 1a of Sector One is affected.

In another preferred embodiment of the configuration illustrated in FIG. 13, if one or more of the modules of a particular sector amplifier is experiencing difficulty both spare amplifiers may be activated to assist or act as replacement modules for the affected sector. A gateway controller card similar to that discussed in U.S. patent application Ser. No. 08/ 662,573 filed Jun. 13, 1996 (CE03173R Leffel et al.), herein incorporated by reference, coordinates the switching sequence by delivering the commands to the amplifier modules, where the commands are derived from programming based on the inputs to the gateway by the amplifier modules sensors, or the gateway can relay a system operator's commands to the amplifier modules.

In this preferred embodiment, if both sector amplifiers of the radio frequency system experience difficulties in one or more of their individual modules concurrently, the modules of the spare amplifier may be independently assigned to either or both of the sector amplifier. More particularly, the resources of the spare amplifier may be "divided" between the sector amplifiers such that the resources of spare amp 1 are directed to Sector 1 and the resources of spare amp 2 are directed to Sector 2 simultaneously. In this preferred embodiment each sector can receive assistance from the spare amplifier at the same time. Alternatively and in accordance with this preferred embodiment the resources of the spare amplifier can be directed solely to one of the sector amplifiers even if both sectors are experiencing difficulties. As with the previous embodiments and in accordance with preferred embodiments of the present invention, the decision as to which sector the resources of the spare amplifiers are directed can be continuously revised, such that the resources of the spare amplifier can be alternated between continuously between the sector amplifiers.

In addition, further advantages and modifications will readily occur to those skilled in the art. The invention, in its broader aspects, is therefore not limited to the specific details, representative apparatus, and illustrative examples shown and described herein. Various modifications and variations can be made to the above specification without varying from the scope or spirit of the invention, and it is intended that the present invention cover all such modifications and variations provided they come within the scope of the following claims and their equivalents.

What is claimed is:

1. A power delivery system for amplifying a radio frequency (RF) signal having a predetermined wavelength, the power delivery system for use in a radio frequency system comprising:

a power splitter;

a spare amplifier, comprising:

an input relay;

a primary input phasing cable responsive to the input relay, having a length based on one-half of the wavelength;

a secondary input phasing cable responsive to the input relay, having a length based on one-quarter of the wavelength;

an output relay;

a primary output phasing cable responsive to the output relay, having a length based on one-half of the wavelength;

a secondary output phasing cable responsive to the output relay, having a length based on one-quarter of the wavelength;

at least two sector amplifiers responsive to the power splitter and coupled to the spare amplifier, the spare amplifier adapted, at a first time, to dynamically replace any one of the at least two sector amplifiers, and at a second time, to coherently amplify the RF signal in conjunction with any one of the at least two sector amplifiers, each of the at least two sector amplifiers comprising:

an input switch;

an input phasing line responsive to the input switch, having a length based on the combined length of the primary input phasing cable and the secondary input phasing cable;

an output switch responsive to the sector amplifier;

an output phasing line responsive to the output switch, having a length based on the combined length of the primary output phasing cable and the secondary output phasing cable; and a power combiner responsive to each of the at least two sector amplifiers.

* * * * *